United States Patent
Kawamoto

(10) Patent No.: US 10,427,256 B2
(45) Date of Patent: Oct. 1, 2019

(54) PRINTED SUBSTRATE HOLDING DEVICE

(71) Applicant: SEIKO PRECISION INC., Narashino-shi, Chiba (JP)

(72) Inventor: Hisashi Kawamoto, Narashino (JP)

(73) Assignee: SEIKO INSTRUMENTS INC., Chiba-shi (JP)

( * ) Notice: Subject to any disclaimer, the term of this patent is extended or adjusted under 35 U.S.C. 154(b) by 917 days.

(21) Appl. No.: 13/675,325

(22) Filed: Nov. 13, 2012

(65) Prior Publication Data
US 2013/0069296 A1 Mar. 21, 2013

Related U.S. Application Data

(63) Continuation of application No. PCT/JP2011/077145, filed on Nov. 25, 2011.

(30) Foreign Application Priority Data

Mar. 31, 2011 (JP) .................................. 2011-079677

(51) Int. Cl.
*B23Q 3/00* (2006.01)
*H05K 7/14* (2006.01)

(52) U.S. Cl.
CPC ............. *B23Q 3/00* (2013.01); *H05K 7/1405* (2013.01)

(58) Field of Classification Search
CPC ...... B23Q 3/00; B23Q 3/2703; H05K 7/1405; B25B 11/007

(Continued)

(56) References Cited

U.S. PATENT DOCUMENTS 6,609,851 B2 * 8/2003 Nordquist ................ B23H 7/26
269/309
6,780,030 B2 * 8/2004 Yoshinaga ......... H01R 13/6582
439/92

(Continued)

FOREIGN PATENT DOCUMENTS

CN  1288350 A  3/2001
CN  101822129 A  9/2010

(Continued)

OTHER PUBLICATIONS

Chinese Office Action dated Oct. 17, 2014 in the corresponding Chinese patent application No. 201180037331.7, with English translation.

(Continued)

*Primary Examiner* — David P Bryant
*Assistant Examiner* — Nirvana Deonauth
(74) *Attorney, Agent, or Firm* — Kratz, Quintos & Hanson, LLP

(57) ABSTRACT

A printed substrate holding device includes: a base member including a recess portion including: a bottom portion; and a side wall portion provided in the bottom portion; and a printed substrate held in the recess portion and having a rigidity, wherein the side wall portion includes a holding portion holding a first surface of the printed substrate, the bottom portion includes a supporting portion supporting a second surface of the printed substrate, the printed substrate slides on the bottom portion and is inserted between the supporting portion and the holding portion, and is held in the recess portion, and the printed substrate is held in the recess portion while being bent.

12 Claims, 7 Drawing Sheets

(58) Field of Classification Search
USPC .............................. 269/903, 289 R, 55, 900
See application file for complete search history.

(56) References Cited

U.S. PATENT DOCUMENTS

2008/0131112 A1* 6/2008 Aoki et al. .................... 396/429
2010/0195304 A1   8/2010 Takao

FOREIGN PATENT DOCUMENTS

| EP | 1 081 729 A2 | 3/2001 |
|----|--------------|--------|
| JP | S63-229799   | 9/1988 |
| JP | H1-171083    | 12/1989 |
| JP | H2-44388     | 3/1990 |
| JP | H5-218668    | 8/1993 |
| JP | H8-107286    | 4/1996 |
| JP | 2009-182190  | 8/2009 |
| JP | 2009-182190 A1 | 8/2009 |

OTHER PUBLICATIONS

Notification of Submission of Opinion dated Dec. 6, 2013 from the Korean Intellectual Property Office in counterpart application No. 10-2012-7028968 with English translation.
Notification of Reason(s) for Refusal dated Sep. 10, 2013 from the Japanese Patent Office Action in counterpart application No. 2011-079677 with English translation.
International Search Report for International Application No. PCT/JP2011/077145 dated Feb. 21, 2012.

* cited by examiner

PRINTED SUBSTRATE HOLDING DEVICE

CROSS-REFERENCE TO RELATED APPLICATION

This application is a continuation of and claims priority to International Patent Application No. PCT/JP2011/077145 filed on Nov. 25, 2011, which claims priority to Japanese Patent Application No. 2011-079677 filed on Mar. 31, 2011, subject matter of these patent documents is incorporated by reference herein in its entirety.

BACKGROUND (i) Technical Field

The present invention relates to printed substrate holding devices.

(ii) Related Art

There is known a device for holding a printed substrate. Such a device includes, for example, a base member supporting the printed substrate, and a pawl portion provided in the base member and provided for holding the printed substrate in the base member. Such a pawl portion is elastically deformable. When the printed substrate is assembled to the base member, an operator pushes the printed substrate toward the base member. Therefore, an edge of the printed substrate abuts with the pawl portion to elastically deform the pawl portion allowing the printed substrate to be assembled to the base member. Japanese Unexamined Patent Application Publication No. 8-107286 discloses a device relevant to such a device.

In order to reduce the thickness of such a device, it is conceivable that the length of the pawl portion is reduced. However, in a case where the pawl portion is short, the pawl portion is greatly bent, when abutting with the printed substrate and being elastically deformed. Therefore, the pawl portion might be broken beyond the elastic limit. Thus, there is a limit in reducing the thickness of such a device.

SUMMARY

It is thus an object of the present invention to provide a printed substrate holding device in which thickness can be reduced.

According to an aspect of the present invention, there is provided a printed substrate holding device including: a base member including a recess portion including: a bottom portion; and a side wall portion provided in the bottom portion; and a printed substrate held in the recess portion and having a rigidity, wherein the side wall portion includes a holding portion holding a first surface of the printed substrate, the bottom portion includes a supporting portion supporting a second surface of the printed substrate, and the printed substrate slides on the bottom portion and is inserted between the supporting portion and the holding portion, and is held in the recess portion.

DETAILED DESCRIPTION

Figure 1:
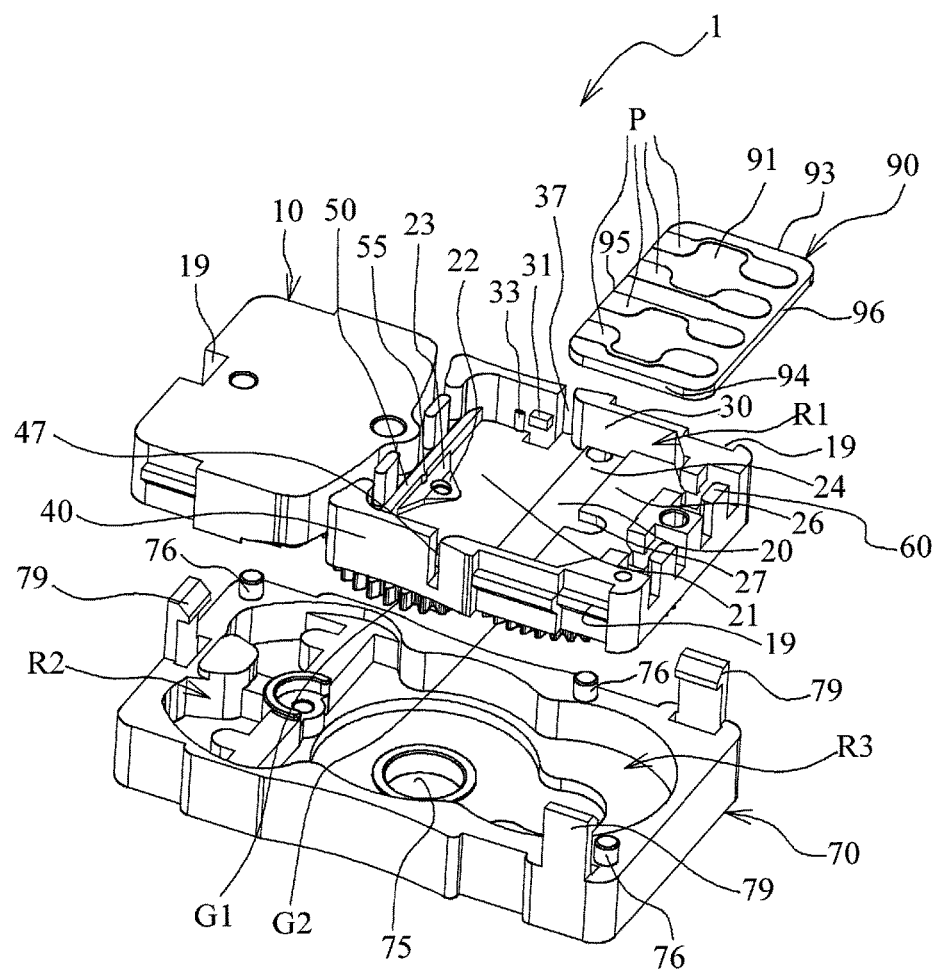
FIG. 1 is an exploded perspective view of a printed substrate holding device.

FIG. 1 is an exploded perspective view of a printed substrate holding device 1. The printed substrate holding device 1 includes base members 10 and 70. The base members 10 and 70 are an example of a base member. The base member 10 is an example of a first base member. The base member 70 is an example of a second base member. The base members 10 and 70 are made of synthetic resin. The base members 10 and 70 are respectively formed with engaging portions 19 and engaging pawls 79. The base members 10 and 70 are assembled to each other by respectively engaging the engaging portions 19 with the engaging pawls 79.

The base member 10 is provided with a recess portion R1 for holding a printed substrate 90. The recess portion R1 occupies substantially half of the whole base member 10. The base member 70 is provided with: a housing portion R2 for housing an actuator (not illustrated) which is electrically connected with the printed substrate 90; and a housing portion R3 for housing gears G1 and G2 to which the drive force is transmitted from the actuator. Additionally, the base member 10 also is provided with a housing portion, not illustrated, which houses the actuator and which has a recess shape. The base members 10 and 70 house the actuator in cooperation with each other. The base member 70 is formed with a shaft hole 75 through which an output shaft connected to any one of the gears G1 and G2 penetrates. The base member 70 is provided with pins 76 for positioning the base member 10 with respect to the base member 70.

The printed substrate 90 has a rigidity. Plural patterns P are formed on the printed substrate 90. The printed substrate 90 has a substantially rectangular shape. The printed substrate 90 includes: a first surface 91 on which the patterns P are formed; a second surface 92 corresponding to a back surface of the first surface 91; edges 93 and 94 at the short sides; and edges 95 and 96 at the long sides. For example, wires are connected to the patterns P by soldering.

The recess portion R1 holds the printed substrate 90. The recess portion R1 includes a bottom portion 20, side wall portions 30 and 40, and a stepped portion 50. The side wall portions 30 and 40 face each other. The stepped portion 50 extends perpendicular to the side wall portions 30 and 40. The height of the stepped portion 50 is lower than each of those of the side wall portions 30 and 40. The bottom portion 20 includes an escaping portion 21, a guiding portion 22, supporting portions 23 and 24, and a wiring supporting portion 26.

The supporting portions 23 and 24 abut with and support the second surface 92 of the printed substrate 90. The escaping portion 21 is formed at the height lower than each of those of the supporting portions 23 and 24. The supporting portion 23 supports the second surface 92 at the edge 95 side of the printed substrate 90. The supporting portion 24 supports the second surface 92 at the edge 96 side of the printed substrate 90. The escaping portion 21 is located between the supporting portions 23 and 24. The guiding portion 22 is provided between the escaping portion 21 and the supporting portion 23. The guiding portion 22 slants with respect to the escaping portion 21 and the supporting portion 23. The wiring supporting portion 26 is formed at the height higher than each of those of the supporting portions 23 and 24. The wiring supporting portion 26 is formed with a cutout portion 27.

The side wall portion 30 is formed with a holding portion 31, an abutting portion 33, and a slit 37. Like the side wall portion 30, the side wall portion 40 also is formed with a holding portion 41, an abutting portion 43, and a slit 47. The holding portion 31 has a semicircular column shape. The slit 37 extends toward the escaping portion 21 of the bottom portion 20. The side wall portions 30 and 40 face the edges 93 and 94 of the printed substrate 90 held in the recess portion R1, respectively.

The stepped portion 50 is located at the front side of the recess portion R1. The stepped portion 50 faces the edge 95 of the printed substrate 90 held in the recess portion R1. The stepped portion 50 is formed with an abutting portion 55. The abutting portion 55 has a semicircular column shape.

The wiring supporting portion 26 supports the wires connected to the patterns P of the printed substrate 90 held in the recess portion R1. The base member 10 is formed at its edge with a wiring holding portion 60. The wiring holding portion 60 holds the wires connected to the patterns P of the printed substrate 90. The wiring holding portion 60 is formed at a position spaced from the printed substrate 90 held in the recess portion R1.

Figure 2:
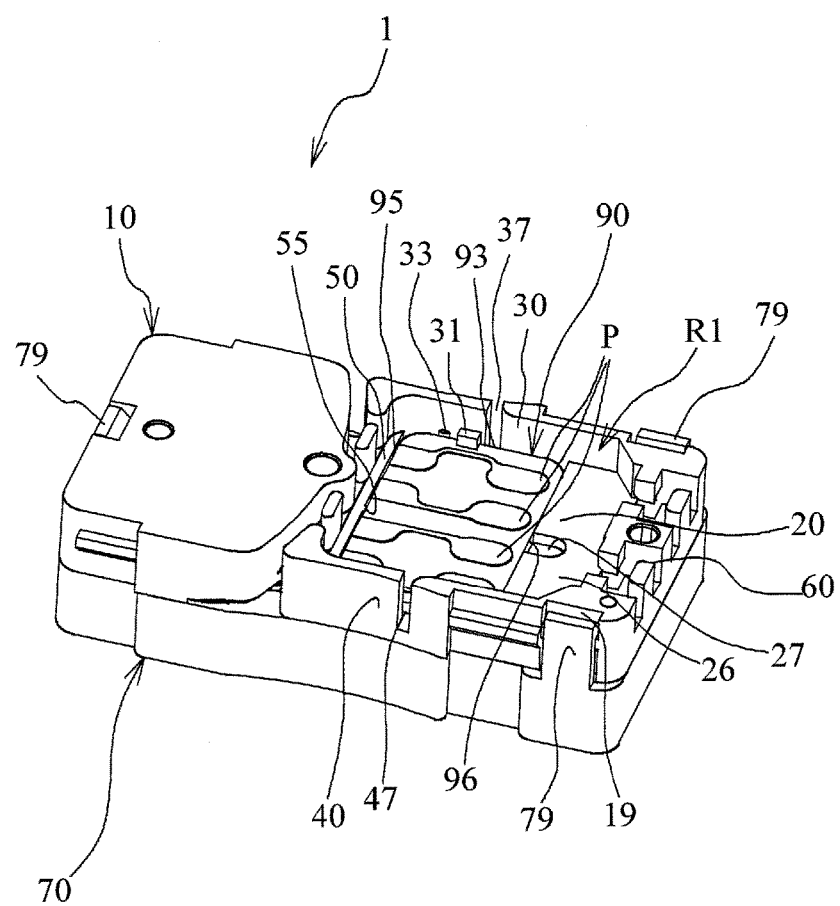
FIG. 2 is a perspective view of the printed substrate holding device which holds a printed substrate.
Figure 3:
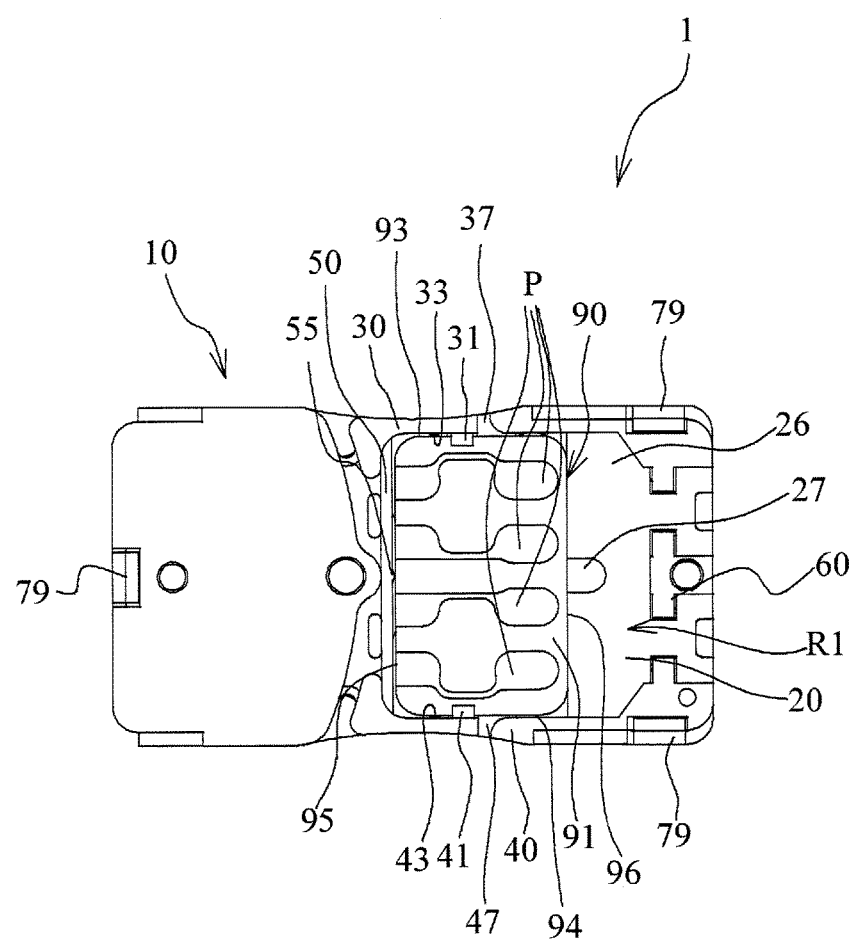
FIG. 3 is a front view of the printed substrate holding device which holds the printed substrate.

FIG. 2 is a perspective view of the printed substrate holding device 1 holding the printed substrate 90. FIG. 3 is a front view of the printed substrate holding device 1 holding the printed substrate 90. The holding portions 31 and 41 hold the first surface 91 of the printed substrate 90. The abutting portions 33, 43, and 55 abut with the edges 93, 94, and 95 of the printed substrate 90, respectively. The second surface 92 of the printed substrate 90 is supported by the supporting portions 23 and 24. Also, a step portion defined by the supporting portion 24 and the wiring supporting portion 26 abuts with the edge 96 of the printed substrate 90. The height of the wiring supporting portion 26 is substantially the same as that of the first surface 91 of the printed substrate 90 held in the recess portion R1.

When the printed substrate 90 is detached from the recess portion R1, an operator picks up the printed substrate 90 with tweezers through the cutout portion 27, and pulls out of the stepped portion 50. Therefore, the printed substrate 90 is removed from the recess portion R1.

A simple description will be given of the assembling order of the printed substrate holding device 1. Firstly, the printed substrate 90 is assembled to the recess portion R1 at one side of the base member 10. Secondly, the base member 10 is reversed such that the printed substrate faces the back side in FIG. 3, and the actuator and the gears G1 and G2 are arranged at given positions in the housing portion not illustrated. Next, the base member 70 is assembled to the other side of the base member 10 such that the engaging pawls 79 respectively engage with the engaging portions 19. Therefore, the printed substrate holding device 1 is assembled.

Figure 4A:
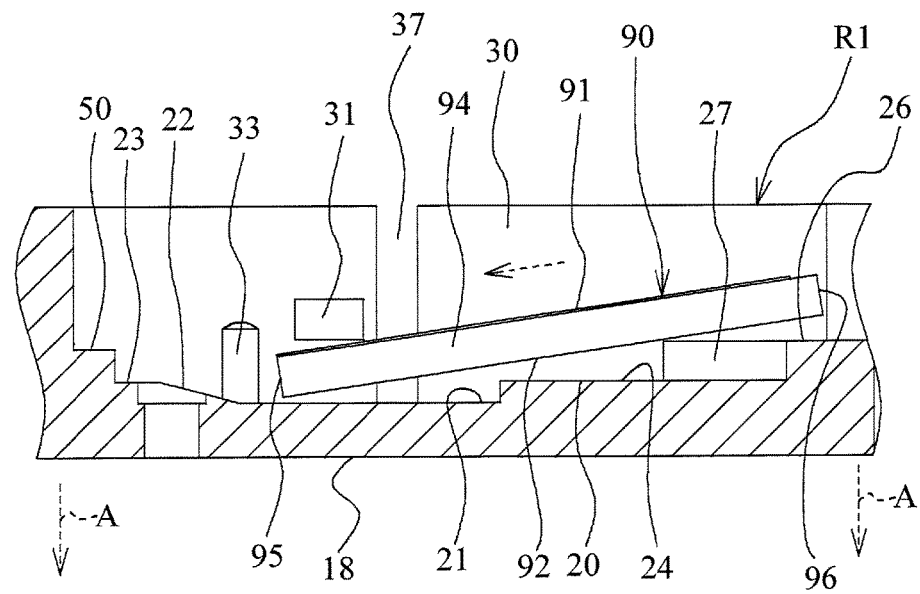
FIGS. 4A and 4B are explanatory views of assembling the printed substrate to a recess portion.
Figure 4B:
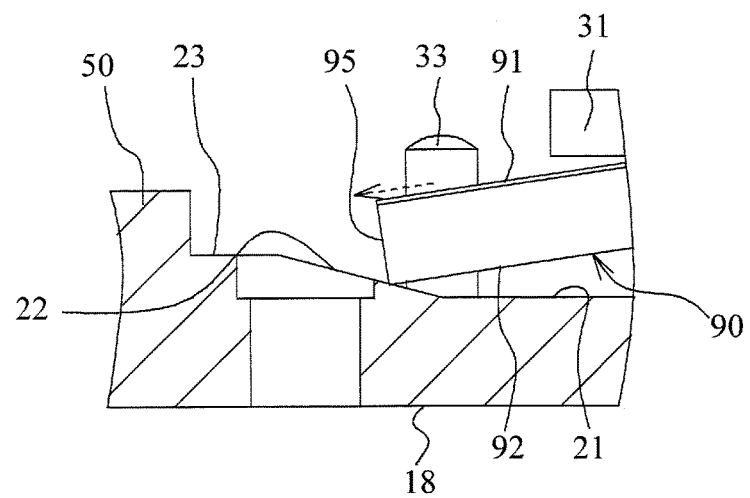

FIGS. 4A and 4B are explanatory views of assembling the printed substrate 90 to the recess portion R1. As illustrated in FIG. 4A, an operator slides the printed substrate 90 on the bottom portion 20 toward the stepped portion 50 side, and inserts the printed substrate 90 between the holding portion 31 and the bottom portion 20. When the printed substrate 90 is further slid from the state illustrated in FIG. 4A, a corner portion between the edge 95 and the second surface 92 of the printed substrate 90 slides along the guiding portion 22. The guiding portion 22 slants and connects the escaping portion 21 with the supporting portion 23. Therefore, the end portion of the printed substrate 90 is guided toward the supporting portion 23.

Herein, the side wall portions 30 and 40 of the base member 10 are formed with slits 37 and 47, respectively. The base member 10 is elastically deformable with ease such that the slits 37 and 47 are spread. Specifically, the base member 10 is elastically deformable with ease such that the both ends of a bottom surface portion 18 at the other side of the base member 10 bend in a direction of arrows A illustrated in FIG. 4A. The direction of the arrow A means the direction toward the base member 70. In other words, the base member 10 is elastically deformable such that the outline of the bottom surface portion 18 becomes concave. The base member 10 is elastically deformed in such a way, whereby the printed substrate 90 is brought into the state of being held by the supporting portions 23 and 24, and the holding portion 31, that is, whereby the printed substrate 90 is brought into the state of being assembled. Thus, the base member 10 for itself allows the printed substrate 90 to be assembled thereto.

Figure 5:
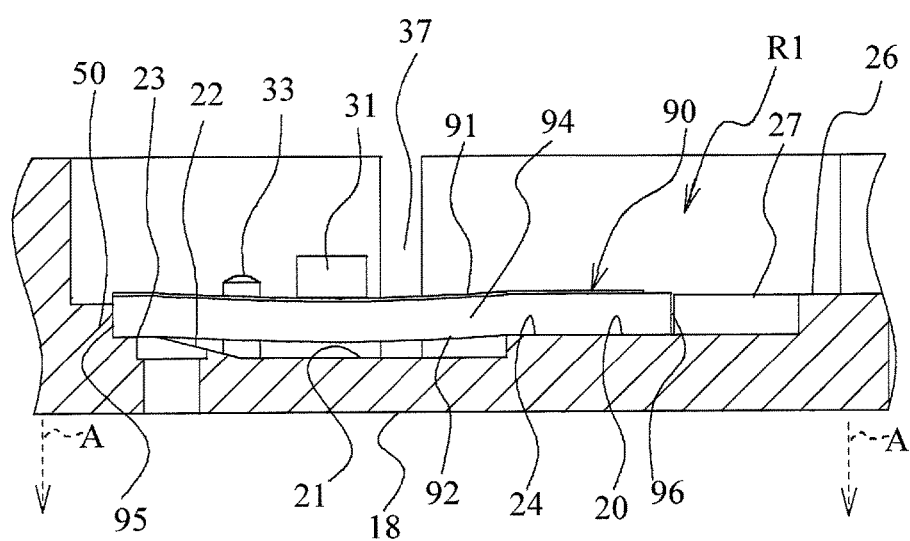
FIG. 5 is a partial sectional view of a base member to which the printed substrate is assembled.

FIG. 5 is a partial sectional view of the base member 10 to which the printed substrate 90 is assembled. Additionally, FIG. 5 illustrates the base member 10 before being assembled to the base member 70. The first surface 91 is held by the holding portion 31. The escaping portion 21 is spaced from the second surface 92. Herein, the thickness of the printed substrate 90 is set substantially the same as the housing space defined by the supporting portions 23 and 24, and the holding portion 31 in the thickness direction of the printed substrate 90. However, as depending on the variation in the dimension of the base member 10 or the printed substrate 90, the printed substrate 90 is thicker or thinner than the above housing space. In a case where the printed substrate 90 is thicker than the above housing space, the escaping portion 21 is provided as illustrated in FIG. 5, whereby the printed substrate 90 is deformed to some extent and is held by its elastic repulsive force without rattling. In a case where the printed substrate 90 is thinner than the above housing space, the abutting portions 33, 43, and 55 ensure the rattling amount which does not cause the problem, and the supported state where the printed substrate 90 is held in the recess portion R1 is maintained. This prevents the printed substrate 90 from being unexpectedly detached from the recess portion R1.

Also, the base member 10 to which the printed substrate 90 is assembled may be slightly bent by the elastic repulsive force of the printed substrate 90, as compared with the base member 10 before being assembled. However, by assembling the base member 70 to the base member 10, the bending of the base member 10 is corrected so as to return to the original state. This is because, by abutting the base member 70 with the bottom surface portion 18 facing the base member 70, the base member 10 tends to return to the state before being assembled. Further, the base member 10 is assembled to the base member 70, so the base member 10 tends not to bend. That is, by assembling the base member 10 with the base member 70, the elastic deformation of the base member 10 is restricted. Thus, the bending of the base member 10 does not occur, unlike the bending occurs in assembling. Therefore, the printed substrate 90 is prevented from being detached from the base member 10.

In such a way, the printed substrate 90 can be held in the recess portion R1 while being bent. This is because the escaping portion 21 is spaced from the printed substrate 90, and the space is defined, for allowing the printed substrate 90 to bend, between the escaping portion 21 and the printed substrate 90. Further, this is because the escaping portion 21 and the holding portion 31 holding the first surface 91 of the printed substrate 90 overlap each other when viewed from a direction perpendicular to the first surface 91 of the printed substrate 90. In other words, this is because the supporting portions 23 and 24, which supports the second surface 92 of the printed substrate 90, and the holding portion 31, which holds the first surface 91 of the printed substrate 90, are formed at positions which do not overlap one another when viewed from the direction perpendicular to the first surface 91 of the printed substrate 90.

It is thus premised that the printed substrate 90 is assembled to the recess portion R1 even when the printed substrate 90 is bent. Therefore, the heights of the supporting portions 23 and 24, the position of the holding portion 31 with respect to the escaping portion 21, or the like may not be designed precisely. Also, even if there are variations in such positions, it matters little.

Also, as mentioned above, the distance between the escaping portion 21 and the holding portion 31 in the perpendicular direction of the escaping portion 21 is greater than the thickness of the printed substrate 90. It is thus easy to insert the printed substrate 90 between the holding portion 31 and the escaping portion 21 as illustrated in FIG. 4A, thereby improving the assemblability of the printed substrate 90.

Further, the front side of the printed substrate 90 is guided to the supporting portion 23 by the guiding portion 22. This also improves the assemblability of the printed substrate 90.

Furthermore, the side wall portions 30 and 40 are formed with the slits 37 and 47 extending toward the bottom portion 20, respectively. The slits 37 and 47 reduce the rigidity of the side wall portions 30 and 40, respectively, thereby facilitating the bending of the side wall portions 30 and 40. The whole of the base member 10 tends to bend such that the widths of the slits 37 and 47 change. In such a way, the base member 10 is made bendable. This is because it is easy to assemble the printed substrate 90 to the base member 10 in a case where the base member 10 tends to bend to some extent in assembling the printed substrate 90 to the base member 10. Also, this is because it is easy to respectively engage the engaging portions 19 and the engaging pawls 79 in a case where the base member 10 tends to bend to some extent in assembling the base member 10 to the base member 70. In such a way, the slits 37 and 47 are provided in consideration of the assemblability of the printed substrate 90 to the base member 10 and the assemblability of the base member 10 to the base member 70.

In the printed substrate holding device 1 according to the present embodiment, after the base member 10 is assembled to the base member 70, the bottom surface portion 18, which is the other surface side of the base member 10, abuts with the base member 70 by engaging the engaging portions 19 with the engaging pawls 79. This restricts the elastic deformation of the base member 10 occurring in assembling the printed substrate 90. Thus, the printed substrate 90 is not detached from the base member 10. In other words, in the state where the base member 10 is assembled to the base member 70 as illustrated in FIG. 2, the base member 10 restricts the printed substrate 90 from being detached.

The abutting portions 33, 43, and 55 each has a rigidity to such an extent to be slightly dented by abutting the printed substrate 90 therewith when the printed substrate 90 is held in the recess portion R1. Even if there is a variation in the size of the printed substrate 90 or there is a variation in the printed substrate holding device 1, the printed substrate 90 is held in the recess portion R1 without rattling.

Figure 6A:
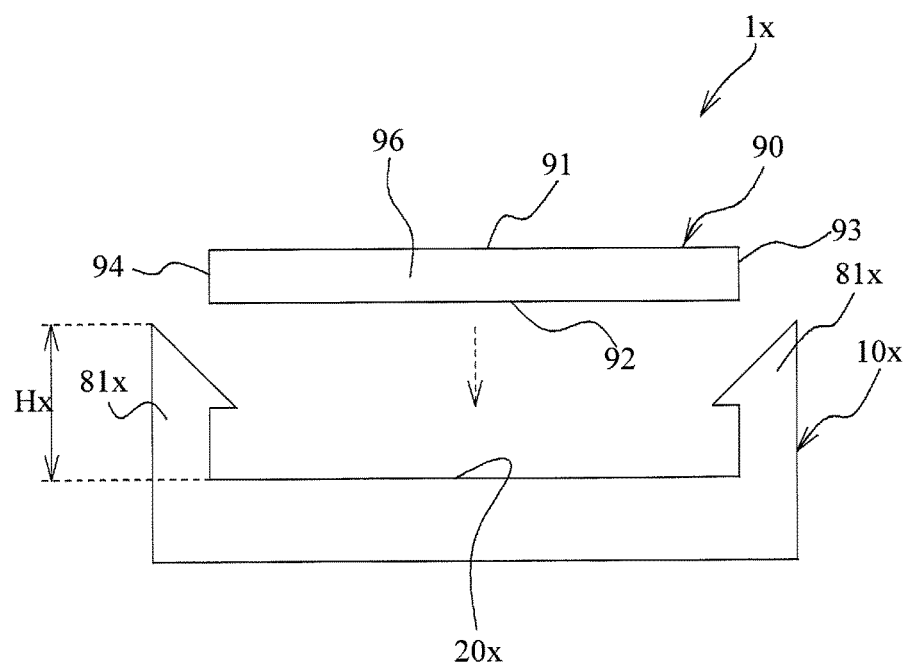
FIGS. 6A and 6B are explanatory views of assembling a printed substrate to a printed substrate holding device having a structure different from that of the printed substrate holding device according to the present embodiment.
Figure 6B:
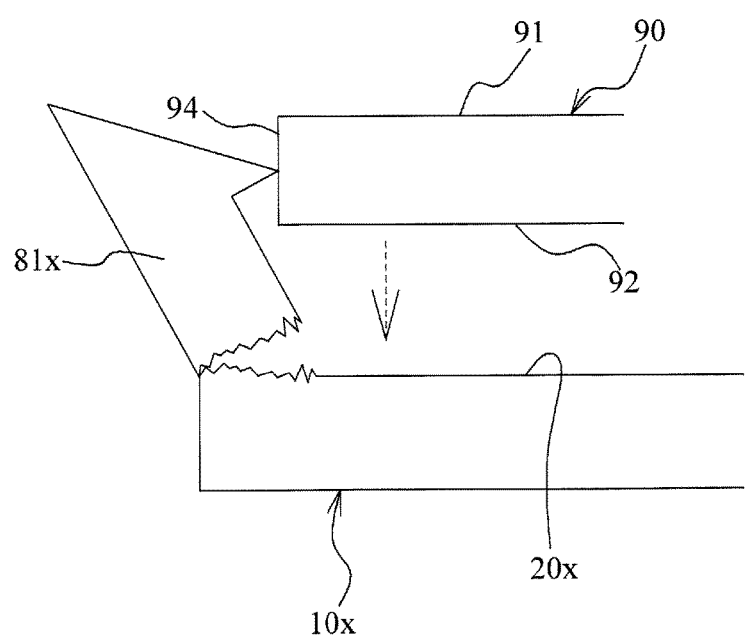

Next, a description will be given of a printed substrate holding device 1x having a structure different from that of the printed substrate holding device 1 according to the present embodiment. FIGS. 6A and 6B are explanatory views of the printed substrate holding device 1x having a structure different from that of the printed substrate holding device 1 according to the present embodiment. As illustrated in FIG. 6A, a base member 10x is provided with two engaging pawls 81x facing each other. As for the engaging pawl 81x, its length Hx is made comparatively short in consideration of a decrease in the thickness of the whole base member 10x. When the printed substrate 90 is inserted between the engaging pawls 81x in order to assemble the printed substrate 90 to a bottom portion 20x of the base member 10x, the edges 93 and 94 of the printed substrate 90 respectively abut with the engaging pawls 81x and the engaging pawls 81x are elastically deformed. When the printed substrate 90 is further pushed toward the base member 10x, the engaging pawls 81x might be broken as illustrated in FIG. 6B. This is because the engaging pawls 81x are too short and the engaging pawls 81x bend beyond the elastic limit. Thus, there is a limit in reducing the thickness of such a printed substrate holding device 1x.

As mentioned above, in the printed substrate holding device 1 according to the present embodiment, the printed substrate 90 slides along the bottom portion 20 to be held in the recess portion R1. Thus, in the printed substrate holding device 1 according to the present embodiment, the above mentioned problem with the printed substrate holding device 1x does not occur.

Figure 7:
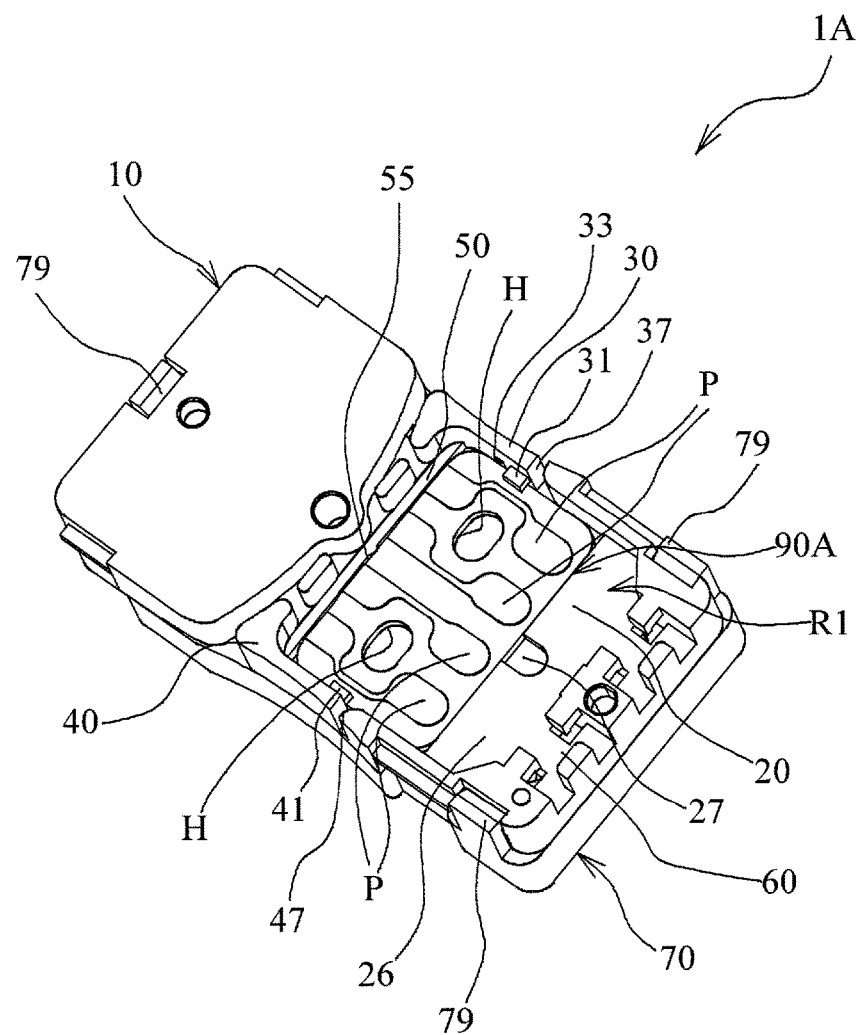
FIG. 7 is a perspective view of a variation of the printed substrate holding device according to the present embodiment.

FIG. 7 is a perspective view of a printed substrate holding device 1A according to a variation of the present embodiment. In the printed substrate holding device 1A, a printed substrate 90A is held. The printed substrate 90A is formed with two through-holes H between patterns P. The through-holes H are formed in the printed substrate 90A, so the rigidity of the printed substrate 90A is lower than that of the printed substrate 90 and the printed substrate 90A tends to bend. For this reason, the printed substrate 90A is inserted into the base member 10 while the printed substrate 90A is bent. After the insertion, the printed substrate 90A tends to return to the original position with the elastic repulsive force, thereby preventing the printed substrate 90A from being detached from the base member 10.

While the exemplary embodiments of the present invention have been illustrated in detail, the present invention is not limited to the above-mentioned embodiments, and other embodiments, variations and modifications may be made without departing from the scope of the present invention.

In the present embodiment, the actuator has been described as an example of an electric part held in the base member 70. However, the electric part may be another part. For example, the electric part may be a printed substrate or an image pickup element.

Finally, several aspects of the present invention are summarized as follows.

According to an aspect of the present invention, there is provided a printed substrate holding device including: a base member including a recess portion including: a bottom portion; and a side wall portion provided in the bottom portion; and a printed substrate held in the recess portion and having a rigidity, wherein the side wall portion includes a holding portion holding a first surface of the printed substrate, the bottom portion includes a supporting portion supporting a second surface of the printed substrate, and the printed substrate slides on the bottom portion and is inserted between the supporting portion and the holding portion, and is held in the recess portion. In such a way, the printed substrate is held in the recess portion. Thus, the printed substrate holding device can be reduced in its thickness, as compared with a case where a printed substrate is held by a pawl portion.

What is claimed is:

1. A printed substrate holding device, comprising: a base member including a recess portion including: a bottom portion; and a side wall portion, the bottom portion continuously located at a lowermost portion of the side wall portion, wherein the recess portion holds a printed substrate, the printed substrate having a rigidity, wherein the side wall portion includes a holding portion holding a first surface of the printed substrate, the bottom portion includes a supporting portion abutting and supporting a second surface of the printed substrate, the printed substrate slides on the bottom portion and is inserted between the supporting portion and the holding portion, and is held in the recess portion by bending both ends in an insertion direction of the printed substrate of a bottom surface portion opposite to the bottom portion of the base member, and the side wall portion includes a slit extending toward the bottom portion, wherein the slit is spreadable to elastically deform the base member.

2. A printed substrate holding device comprising:
   a base member including a recess portion including: a bottom portion; and a side wall portion,
   wherein the recess portion holds a printed substrate, the printed substrate having a rigidity,
   wherein the side wall portion includes a holding portion holding a first surface of the printed substrate,
   the bottom portion includes a supporting portion abutting and supporting a second surface of the printed substrate,
   the printed substrate slides on the bottom portion and is inserted between the supporting portion and the holding portion, and is held in the recess portion by bending both ends in an insertion direction of the printed substrate of a bottom surface portion opposite to the bottom portion of the base member,
   the side wall portion includes a slit extending toward the bottom portion, wherein the slit is spreadable to elastically deform the base member,
   the bottom portion includes an escaping portion receding from the second surface of the printed substrate,
   the escaping portion is provided at a position overlapping the holding portion when viewed from a direction perpendicular to the first surface of the printed substrate, and
   the bottom portion includes a guiding portion extending from the escaping portion toward the supporting portion and guiding the printed substrate toward the supporting portion.

3. The printed substrate holding device of claim 1, wherein
   the bottom portion includes an escaping portion receding from the second surface of the printed substrate, and
   the escaping portion is provided at a position overlapping the holding portion when viewed from a direction perpendicular to the first surface of the printed substrate.

4. The printed substrate holding device of claim 3, wherein the bottom portion includes a guiding portion extending from the escaping portion toward the supporting portion and guiding the printed substrate toward the supporting portion.

5. The printed substrate holding device of claim 1, wherein the side wall portion includes an abutting portion abutting with an edge of the printed substrate.

6. The printed substrate holding device of claim 1, wherein the supporting portion and the holding portion are respectively provided at positions that do not overlap each other when viewed from a direction perpendicular to the first surface of the printed substrate.

7. The printed substrate holding device of claim 1, wherein:
   the base member includes a first base member holding the printed substrate, and a second base member capable of being assembled to the first base member,
   before the first and second base members are assembled to each other, the first base member is elastically deformed by the slit to allow the printed substrate to be assembled to the first base member, and
   after the first and second base members are assembled to each other, the second base member restricts the first base member from being elastically deformed to restrict the printed substrate from being detached from the first base member.

8. The printed substrate holding device of claim 7, wherein the second base member engages with the first base member by a snap fit.

9. The printed substrate holding device of claim 7, wherein bending of the first base member is corrected by engagement of the first base member with the second base member.

10. The printed substrate holding device of claim 7, wherein the second base member holds an electric part electrically connected to the printed substrate.

11. The printed substrate holding device of claim 1, wherein the printed substrate includes at least one through hole to facilitate the printed substrate to be held in the recess portion in a state where the printed substrate is bent.

12. A printed substrate holding device, comprising: a base member including a recess portion including: a bottom portion; and a side wall portion, the bottom portion continuously located at a lowermost portion of the side wall portion, wherein the recess portion holds a printed substrate, the printed substrate having a rigidity, wherein the side wall portion includes a holding portion holding a first surface of the printed substrate, the bottom portion includes a supporting portion abutting and supporting a second surface of the printed substrate, the first surface of the printed substrate being opposite the second surface of the printed substrate, the printed substrate slides on the bottom portion and is inserted between the supporting portion and the holding portion, and is held in the recess portion, the printed substrate is held in the recess portion while being bent, and the side wall portion includes an abutting portion abutting with an edge of the printed substrate, and the side wall portion includes a slit extending towards the bottom portion, wherein the slit is spreadable to elastically deform the base member.

* * * * *